US008054688B2

(12) United States Patent
Jeong et al.

(10) Patent No.: US 8,054,688 B2
(45) Date of Patent: Nov. 8, 2011

(54) NON-VOLATILE MEMORY DEVICE AND ERASE METHOD

(75) Inventors: Jae-hun Jeong, Hwaseong-si (KR); Soon-moon Jung, Seongnam-si (KR); Han-soo Kim, Suwon-si (KR); Jae-hoon Jang, Seongnam-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 331 days.

(21) Appl. No.: 12/539,829

(22) Filed: Aug. 12, 2009

(65) Prior Publication Data

US 2010/0046304 A1    Feb. 25, 2010

(30) Foreign Application Priority Data

Aug. 25, 2008 (KR) .................... 10-2008-0083026

(51) Int. Cl.
G11C 16/04 (2006.01)
(52) U.S. Cl. ................. 365/185.17; 365/185.11
(58) Field of Classification Search .......... 365/185.17, 365/185.11, 185.29; 257/723, 724, 315
See application file for complete search history.

(56) References Cited

U.S. PATENT DOCUMENTS 7,592,664 B2 *  9/2009  Lee ................... 257/315
7,728,427 B2 *  6/2010  Gabara ............... 257/723

FOREIGN PATENT DOCUMENTS

| JP | 2002368141 A | 12/2002 |
| KR | 1020060098044 A | 9/2006 |
| KR | 100673019 B1 | 1/2007 |

* cited by examiner

*Primary Examiner* — Vu Le
(74) *Attorney, Agent, or Firm* — Volentine & Whitt, PLLC

(57) ABSTRACT

Provided is a non-volatile memory device including first and second, vertically stacked semiconductor substrates, a plurality of non-volatile memory cell transistors formed in a row on the first and second semiconductor substrates, and a plurality of word lines connected to gates of the plurality of non-volatile memory cell transistors. The plurality of non-volatile memory cell transistors are grouped into two or more memory cell blocks, such that a first voltage is applied to the first semiconductor substrate including a first memory cell block to be erased, and either (1) a second voltage less than the first voltage and greater than 0V is applied to the second semiconductor substrate not including the first memory cell block, or (2) the second semiconductor substrate not including the first memory cell block is allowed to electrically float.

19 Claims, 7 Drawing Sheets

| Signal | FIG. 3, FIG. 4 | FIG. 6 |
|---|---|---|
| Select W/L | V4 | 0(V) |
| Unselect W/L | V3 | Floating |
| Select Substrate | V1 | V1 |
| Unselected Substrate | V2 or Floating | 0(V) |
| BL | Floating | Floating |
| CSL | Floating | Floating |
| Selected SSL, GSL | V1 | Floating |
| Unselected SSL, GSL | V1 | Floating |

NON-VOLATILE MEMORY DEVICE AND ERASE METHOD

CROSS-REFERENCE TO RELATED APPLICATIONS

This application claims the benefit of Korean Patent Application No. 10-2008-0083026 filed on Aug. 25, 2008, the subject matter of which is hereby incorporated by reference.

BACKGROUND

The inventive concept relates to a non-volatile memory device, and more particularly, to a non-volatile memory device preventing current leakage and associated unexpected programming. The inventive concept is also related to an erase method for a non-volatile memory device.

Certain types of non-volatile memory, such as flash memory, are electrically erasable and programmable. Despite the relative ease of data manipulation provided by electrical programming and erasing, non-volatile memory is yet able to retain stored data in absence of applied power making it an excellent choice for many technical applications.

SUMMARY

The inventive concept provides a non-volatile memory device preventing current leakage and unexpected programming. The inventive concept also provides an erase method for a non-volatile memory device preventing current leakage and unexpected programming.

According to one aspect of the inventive concept, there is provided a non-volatile memory device including first and second, vertically stacked semiconductor substrates, a plurality of non-volatile memory cell transistors formed in a row on the first and second semiconductor substrates; and a plurality of word lines connected to gates of the plurality of non-volatile memory cell transistors. The plurality of non-volatile memory cell transistors as formed on the first and second semiconductor substrates are grouped into two or more memory cell blocks, such that a first voltage is applied to the first semiconductor substrate including a first memory cell block to be erased, and either (1) a second voltage less than the first voltage and greater than 0V is applied to the second semiconductor substrate not including the first memory cell block, or (2) the second semiconductor substrate not including the first memory cell block is allowed to electrically float.

According to another aspect of the inventive concept, there is provided a flash memory card including; a memory controller configured to control the operation of a non-volatile memory device. The non-volatile memory device includes; first and second, vertically stacked semiconductor substrates, a plurality of non-volatile memory cell transistors formed in a row on the first and second semiconductor substrates, and a plurality of word lines connected to gates of the plurality of non-volatile memory cell transistors, wherein the plurality of non-volatile memory cell transistors as formed on the first and second semiconductor substrates are grouped into two or more memory cell blocks, such that a first voltage is applied to the first semiconductor substrate including a first memory cell block to be erased, and either (1) a second voltage less than the first voltage and greater than 0V is applied to the second semiconductor substrate not including the first memory cell block, or (2) the second semiconductor substrate not including the first memory cell block is allowed to electrically float.

According to another aspect of the inventive concept, there is provided a flash memory system including; a Central Processing Unit (CPU) configured to control the operation of a memory system and connected to the memory system via a system bus. The memory system includes; a memory controller configured to control the operation of a non-volatile memory device. The non-volatile memory device includes; first and second, vertically stacked semiconductor substrates, a plurality of non-volatile memory cell transistors formed in a row on the first and second semiconductor substrates, and a plurality of word lines connected to gates of the plurality of non-volatile memory cell transistors, wherein the plurality of non-volatile memory cell transistors as formed on the first and second semiconductor substrates are grouped into two or more memory cell blocks, such that a first voltage is applied to the first semiconductor substrate including a first memory cell block to be erased, and either (1) a second voltage less than the first voltage and greater than 0V is applied to the second semiconductor substrate not including the first memory cell block, or (2) the second semiconductor substrate not including the first memory cell block is allowed to electrically float.

According to another aspect of the inventive concept, there is provided a non-volatile memory device including; first and second, vertically stacked semiconductor substrates, and a plurality of non-volatile memory cell transistors formed in a row on the semiconductor substrates. The plurality of non-volatile memory cell transistors formed on the first and second semiconductor substrates are grouped into two or more memory cell blocks, such that a first voltage is applied to the first semiconductor substrate including a first memory cell block to be erased, a second voltage less than the first voltage and greater than 0V is applied to the second semiconductor substrate not including the first memory cell block, and a third voltage greater than the second voltage and less than the first voltage is applied to gates of non-volatile memory cell transistors in memory cell blocks that are in a different column from the first memory cell block.

According to another aspect of the inventive concept, there is provided an erase method for a non-volatile memory device. The non-volatile memory device includes first and second, vertically stacked semiconductor substrates, and a plurality of non-volatile memory cell transistors formed in a row on the first and second semiconductor substrates, wherein the plurality of non-volatile memory cell transistors formed on the first and second semiconductor substrates are grouped into two or more memory cell blocks. The method includes; applying a first voltage to the first semiconductor substrate including a first memory cell block to be erased, and either (1) applying a second voltage less than the first voltage and greater than 0V to the second semiconductor substrate not including the first memory cell block, or (2) applying a floating voltage to the second semiconductor substrate not including the first memory cell block.

BRIEF DESCRIPTION OF THE DRAWINGS

Exemplary embodiments of the inventive concept will be more clearly understood from the following detailed description taken in conjunction with the accompanying drawings in which.

DESCRIPTION OF EMBODIMENTS

Certain embodiments of the inventive concept will now be described with reference to the accompanying drawings. However, the inventive concept may be variously embodied and should not be construed as being limited to only the illustrated embodiments. Rather, the illustrated embodiments are presented as teaching examples. Throughout the drawings and the written description, like reference numerals and labels are used to indicate like or similar elements and features.

Flash memory cells generally include a cell transistor having a control gate, a floating gate, a source and a drain. The flash memory cell transistor allows programming or erasing of the corresponding memory cell using a well-understood phenomenon referred to as "the F-N tunneling effect."

An erase operation is performed via the flash memory cell transistor by applying a ground voltage to the control gate and a voltage higher than a defined power voltage to the constituent semiconductor substrate (commonly referred as "the bulk"). Under these erase bias conditions, a strong electric field is generated between the floating gate and electrons existing in the floating gate are discharged (or emitted) by the F-N tunneling effect. Thus, the erase operation generally reduced the threshold voltage of the memory cell transistor.

A program operation is performed via the memory cell transistor by applying a voltage higher than the power voltage to the control gate and a ground voltage to the drain and the bulk. Under these programming bias conditions, electrons are injected onto the floating gate of the cell transistor by an F-N tunneling effect. Thus, the program operation generally increases the threshold voltage of the memory cell transistor.

Figure 1A:
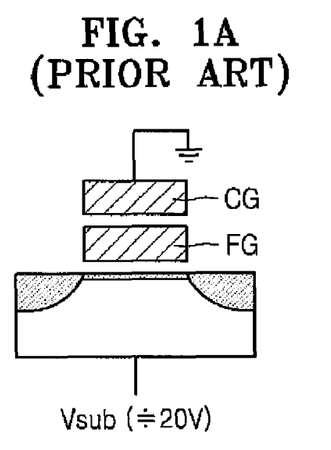
FIGS. 1A and 1B are cross-sectional views of memory cells capable of being incorporated within a non-volatile memory device according to an embodiment of the inventive concept.
Figure 1B:
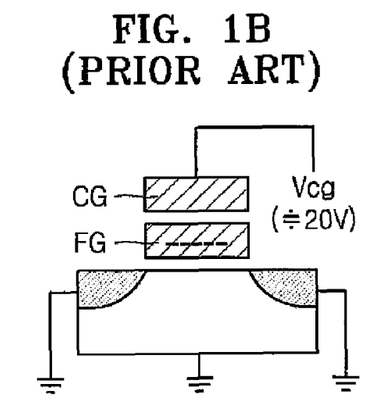

FIGS. 1A and 1B are cross-sectional views of conventional memory cell capable of being incorporated into a non-volatile memory device according to an embodiment of the inventive concept. While the general structure of these memory cells may be known to those skilled in the art, the individual and collective operation and use of such (as well as related methods) are the subject of the present inventive concept.

FIG. 1A illustrates exemplary erase operation bias conditions, wherein electrons are discharged from the floating gate FG of the memory cell of the non-volatile memory device. FIG. 1B illustrates exemplary program operation bias conditions, wherein electrons are injected onto the floating gate FG of the memory cell of the non-volatile memory device. An assumption is made in these examples regarding the level of the voltage applied to the bulk and control gate CG respectively (i.e., the voltage higher than a power supply voltage being 20V)

Figure 2:
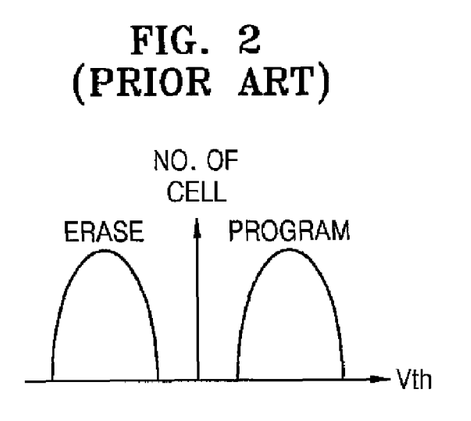
FIG. 2 is a graph further explaining the operation of the memory cells of FIG. 1.

FIG. 2 is a graph further explaining the operation of the exemplary memory cell of FIG. 1. Referring to FIG. 2, a threshold voltage for the program state is greater than 0V, and a threshold voltage of the erase state is less than 0V.

Figure 3:
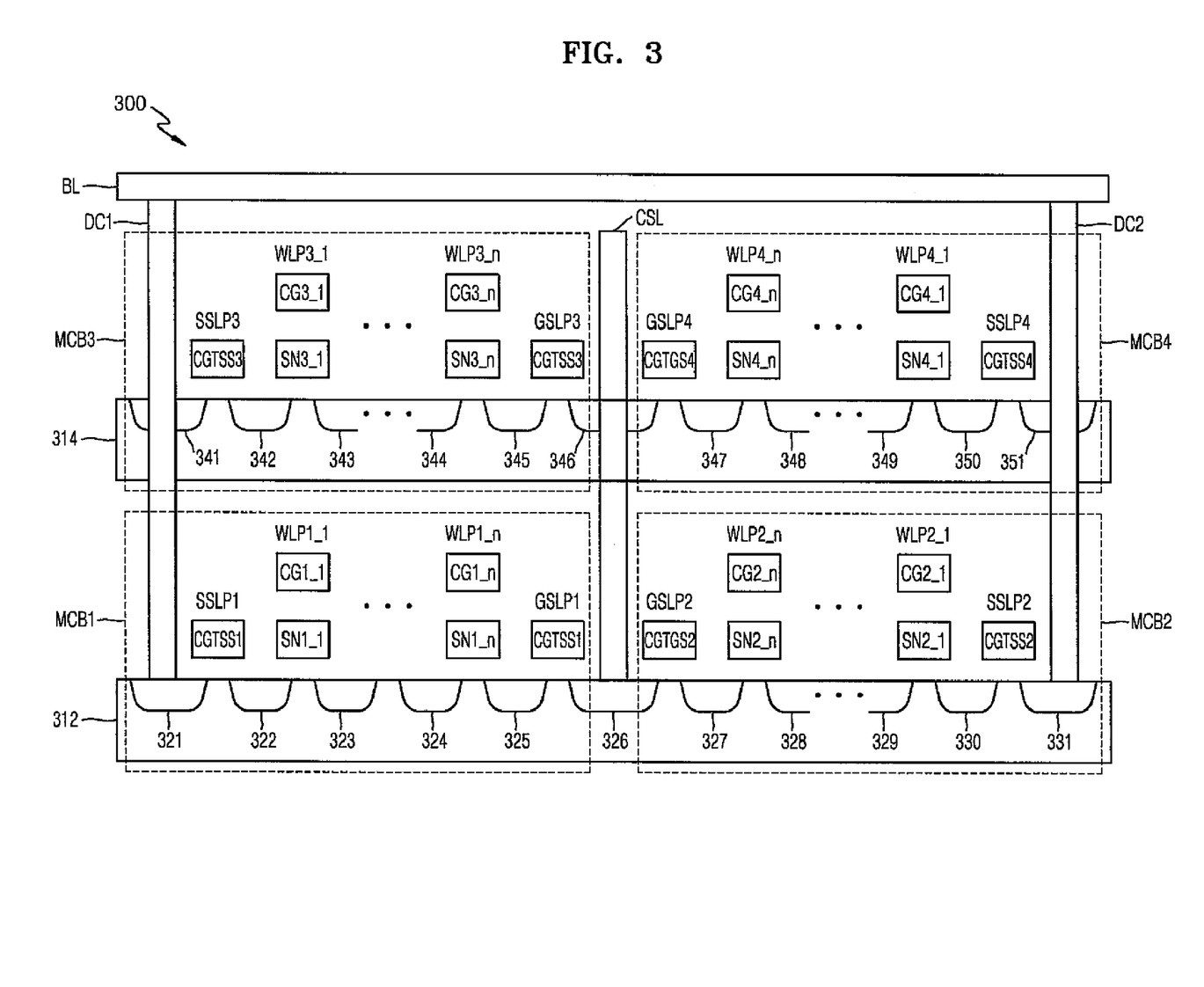
FIG. 3 is a front view of a non-volatile memory device according to an embodiment of the inventive concept.
Figure 4:
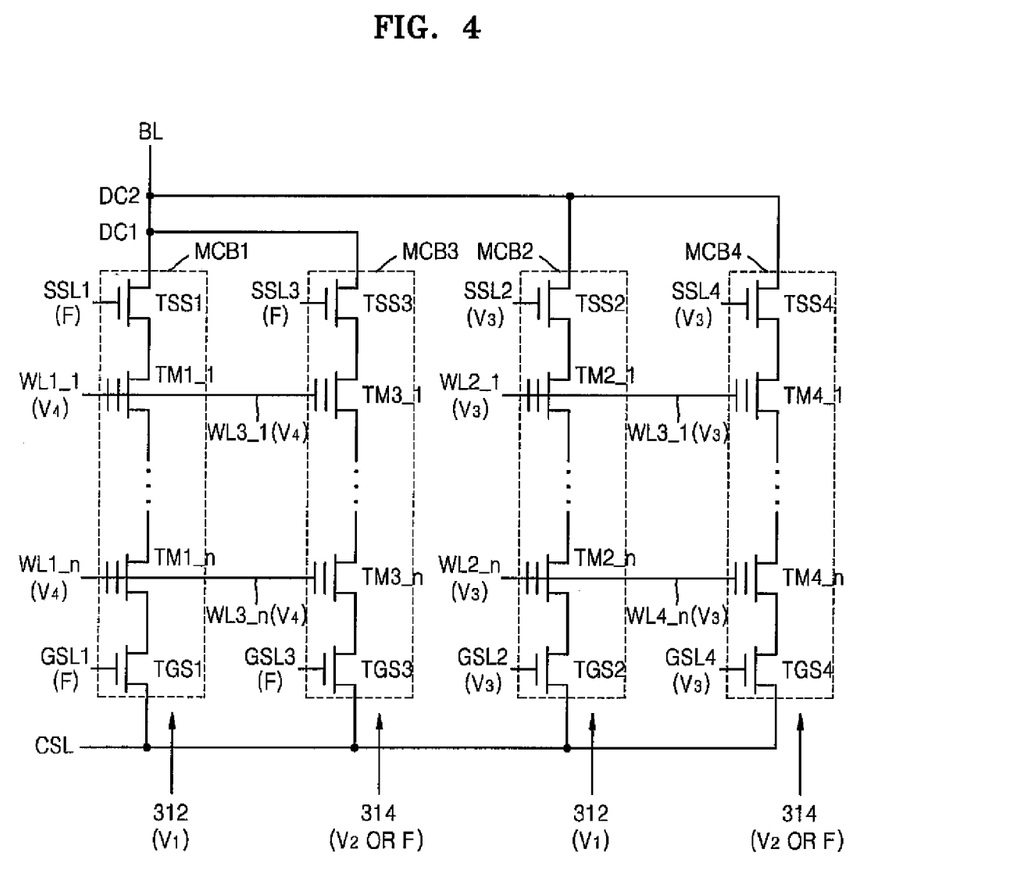
FIG. 4 is a circuit diagram related to the non-volatile memory device of FIG. 3.

FIG. 3 is a front view of a non-volatile memory device according to an embodiment of the inventive concept. FIG. 4 is a related circuit diagram for the non-volatile memory device of FIG. 3.

Referring collectively to FIGS. 3 and 4, first and second semiconductor substrates 312 and 314, a plurality of non-volatile memory cell transistors TM1_1 through TM1_$n$, TM2_1 through TM2_$n$, TM3_1 through TM3_$n$, and TM4_1 through TM4_$n$, and a plurality of word lines WL1_1 through WL1_$n$, WL2_1 through WL2_$n$, WL3_1 through WL3_$n$, and WL4_1 through WL4_$n$ are provided.

The first and second semiconductor substrates 312 and 314 are vertically stacked within the example of FIG. 3, but embodiments of the inventive concept are not limited thereto. For example, certain non-volatile memory devices including three or four stacked semiconductor substrates may be implemented according to the dictates of the present inventive concept. In this context the term "vertically" is used to denote a relative orientation to an assumed "horizontally" running primary surface of said semiconductor substrates.

The non-volatile memory cell transistors TM1_1 through TM1_$n$, TM2_1 through TM2_$n$, TM3_1 through TM3_$n$, and TM4_1 through TM4_$n$ are formed in a row on the first and second semiconductor substrates 312 and 314. In FIG. 3, the non-volatile memory cell transistors TM1_1 through TM1_$n$ and TM3_1 through TM3_$n$ are formed in a row on the first semiconductor substrate 312 as a first layer, and the non-volatile memory cell transistors TM2_1 through TM2_$n$ and TM4_1 through TM4_$n$ are formed in a row on the second semiconductor substrate 314 as a second layer.

The non-volatile memory cell transistors TM1_1 through TM1_$n$, TM2_1 through TM2_$n$, TM3_1 through TM3_$n$, and TM4_1 through TM4_$n$ formed on the first and second semiconductor substrates 312 and 314 are grouped into two or more memory cell blocks MCB1 through MCB4. From among the non-volatile memory cell transistors TM1_1 through TM1_$n$ and TM3_1 through TM3_$n$ formed on the first semiconductor substrate 312, the non-volatile memory cell transistors TM1_1 through TM1_$n$ may belong to the first memory cell block MCB1, and the non-volatile memory cell transistors TM3_1 through TM3_$n$ may belong to the second memory cell block MCB2. From among the non-volatile memory cell transistors TM2_1 through TM2_$n$ and TM4_1 through TM4_$n$ formed on the second semiconductor substrate 314, the non-volatile memory cell transistors TM2_1 through TM2_$n$ may belong to the third memory cell block MCB3, and the non-volatile memory cell transistors TM4_1 through TM4_$n$ may belong to the fourth memory cell block MCB4. For convenience of description, it is assumed that the number of memory cell blocks provided in a semiconductor substrate of a single layer is two, but the inventive concept is not limited thereto. That is, three or more memory cell blocks may be provided.

Referring to FIG. 3, the non-volatile memory cell transistors TM1_1 through TM1_$n$, TM2_1 through TM2_$n$, TM3_1 through TM3_$n$, and TM4_1 through TM4_$n$ may include a stack structure of charge storage layers SN1_1 through SN1_$n$, SN2_1 through SN2_$n$, SN3_1 through SN3_$n$, and SN4_1 through SN4_$n$, and control gate electrodes CG1_1 through CG1_$n$, CG2_1 through CG2_$n$, CG3_1 through CG3_$n$, and CG4_1 through CG4_$n$, formed on the first and second semiconductor substrates 312 and 314. In addition, the non-volatile memory cell transistors TM1_1 through TM1_$n$, TM2_1 through TM2_$n$, TM3_1 through TM3_$n$, and TM4_1 through TM4_$n$ may include source and drain regions 321 through 331 and 341 through 351. For example, the non-volatile memory cell transistor TM1_1 may include the source and drain regions 322 and 323, the charge storage layer SN1_1 and the control gate electrode CG_1.

The control gate electrodes CG1_1 through CG1_$n$, CG2_1 through CG2_$n$, CG3_1 through CG3_$n$, and CG4_1 through CG4_$n$ are spaced apart from and above the charge storage layers SN1_1 through SN1_$n$, SN2_1 through SN2_$n$, SN3_1 through SN3_$n$, and SN4_1 through SN4_$n$ by a blocking insulating layer (not shown). The charge storage layers SN1_1 through SN1_$n$, SN2_1 through SN2_$n$, SN3_1 through SN3_$n$, and SN4_1 through SN4_$n$ may be used as a floating gate layer or a charge trap layer. Furthermore, a tunneling insulating layer (not shown) may be disposed between the first and second semiconductor substrates 312 and 314 and the charge storage layers SN1_1 through SN1_$n$, SN2_1 through SN2_$n$, SN3_1 through SN3_$n$, and SN4_1 through SN4_$n$.

Source and drain regions 321 through 331 and 341 through 351 may be formed by doping impurities on the first and second semiconductor substrates 312 and 314. For example, when the first and second semiconductor substrates 312 and 314 are of a first conductive type, the source and drain regions 321 through 331 and 341 through 351 may be doped with the opposite type of conductive impurities (i.e., second conductive type impurities) to the first and second semiconductor substrates 312 and 314. Thus, the source and drain regions 321 through 331 and 341 through 351, and the first and second semiconductor substrates 312 and 314 may form respective diode junctions.

A portion of a semiconductor substrate SUB may provide a conductive path of charges. The semiconductor substrate SUB may include silicon, germanium or silicon-germanium.

Figure 5:
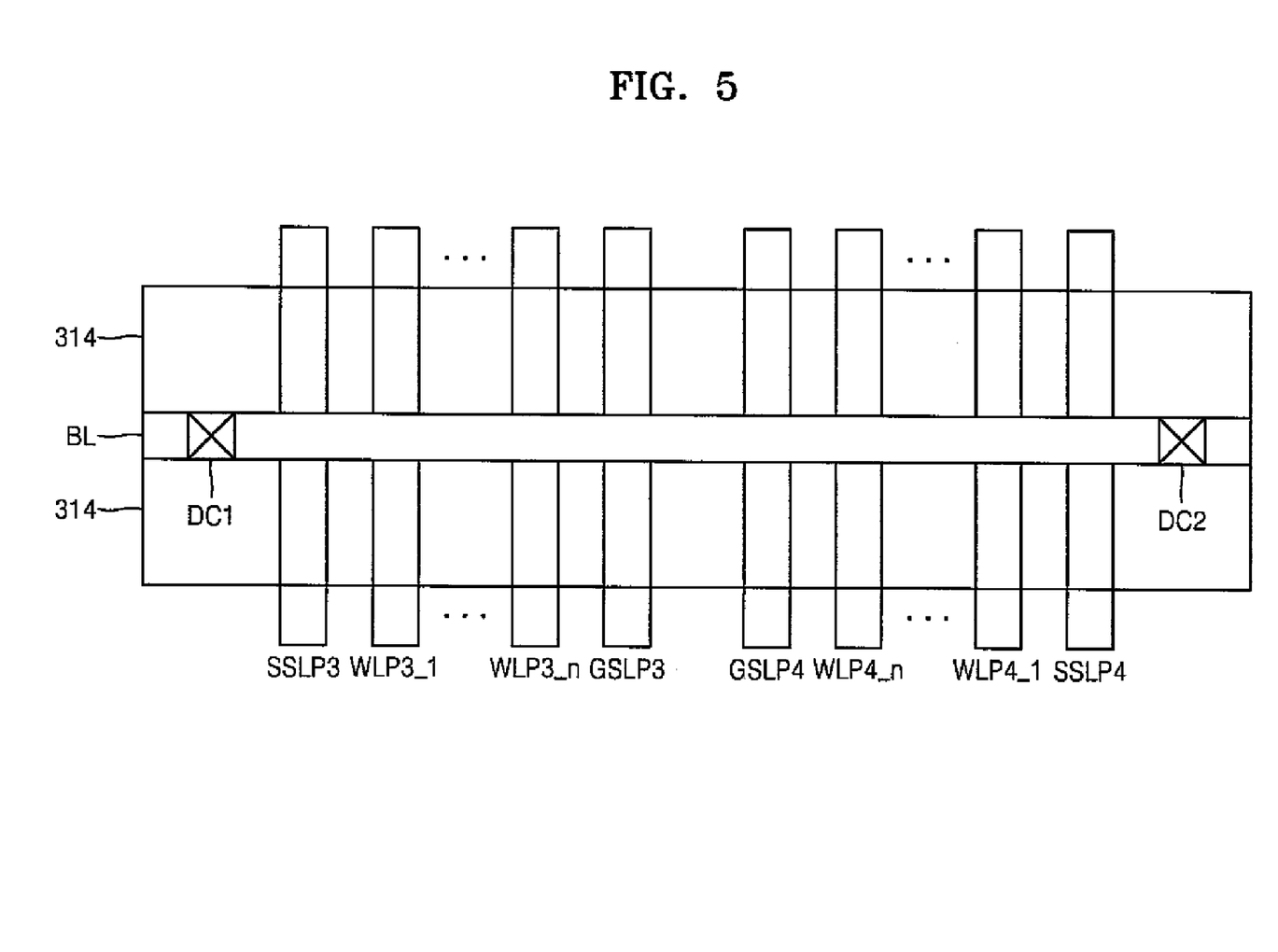
FIG. 5 is a partial plan view of the non-volatile memory device of FIG. 3.

FIG. 5 is a partial plan view of the non-volatile memory device of FIG. 3.

Referring to FIGS. 3 through 5, the control gate electrodes CG1_1 through CG1_$n$, CG2_1 through CG2_$n$, CG3_1 through CG3_$n$, and CG4_1 through CG4_$n$ of FIG. 4 may be included in word line patterns WLP1_1 through WLP1_$n$, WLP2_1 through WLP2_$n$, WLP3_1 through WLP3_$n$, and WLP4_1 through WLP4_$n$ of FIG. 5, respectively. In addition, the word line patterns WLP1_1 through WLP1_$n$, WLP2_1 through WLP2_$n$, WLP3_1 through WLP3_$n$, and WLP4_1 through WLP4_$n$ of FIG. 5 may function as the word lines WL1_1 through WL1_$n$, WL2_1 through WL2_$n$, WL3_1 through WL3_$n$, and WL4_1 through WL4_$n$ of FIG. 4, respectively.

Referring to FIGS. 3 and 4, by applying various voltages through gates of the non-volatile memory cell transistors TM1_1 through TM1_$n$, TM2_1 through TM2_$n$, TM3_1 through TM3_$n$, and TM4_1 through TM4_$n$ and the semiconductor substrates 312 and 314, an operation (e.g., a program operation, a reading operation and an erase operation) on the non-volatile memory cell transistors TM1_1 through TM1_$n$, TM2_1 through TM2_$n$, TM3_1 through TM3_$n$, and TM4_1 through TM4_$n$ can be performed.

Figure 6:
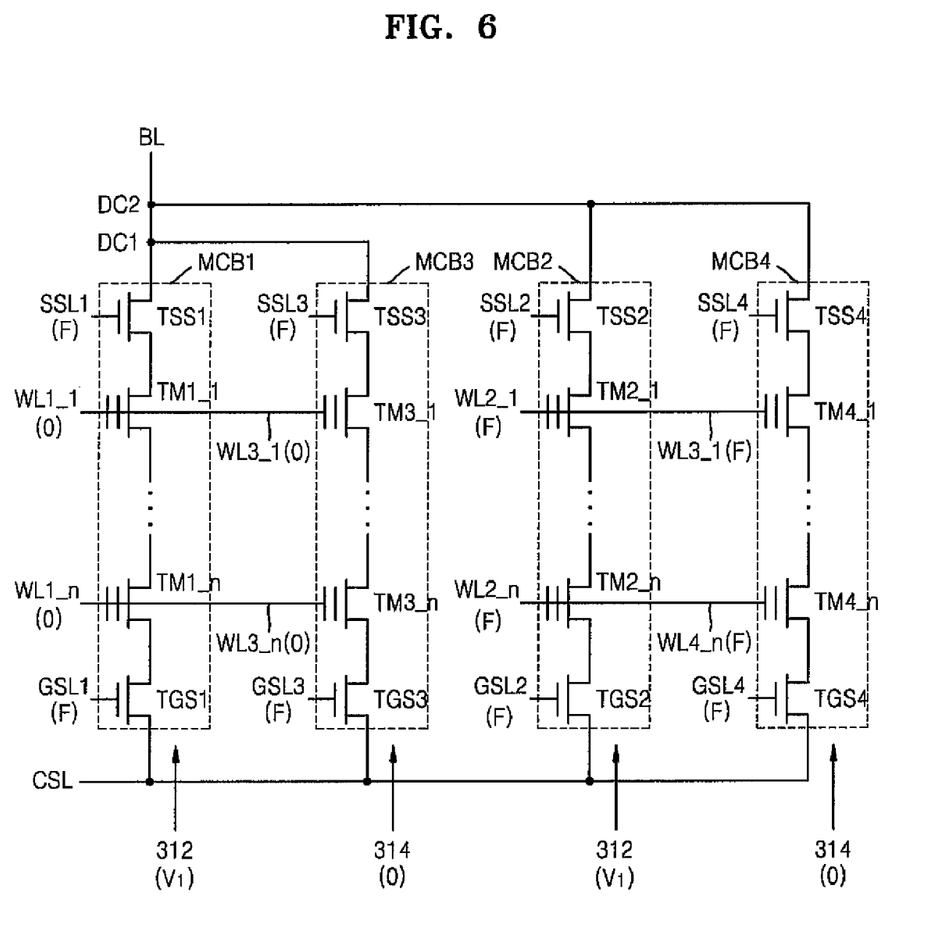
FIG. 6 is a circuit diagram for a non-volatile memory device as a comparative example.

An erase operation may be performed on a block-by-block basis of a memory cell block. The erase operation of the non-volatile memory device of FIG. 3 will be described with reference to FIGS. 3 and 4. In addition, a comparative example for comparison with the non-volatile memory device of FIG. 3 will be described with reference to FIG. 6. Hereinafter, it is assumed that the first memory cell block MCB1 is subjected to the erase operation.

A first voltage V1 is applied to the first semiconductor substrate 312 in which the first memory cell block MCB1 to which the erase operation is to be performed belongs, and a second voltage V2 is applied to the second semiconductor substrate 314 in which the first memory cell block MCB1 to which the erase operation is to be performed does not belong. The first voltage V1 has a voltage level such that the erase operation can be performed on the first memory cell block MCB1. The second voltage V2 is less than the first voltage V1 and greater than 0V.

If it is assumed that 0V is applied to the second semiconductor substrate 314 when a bit line BL and a charge supply line CSL are commonly connected to the first semiconductor substrate 312 and the second semiconductor substrate 314 (see FIG. 6), current leakage might occur between the first semiconductor substrate 312 and the second semiconductor substrate 314 due to a large voltage difference therebetween. On the other hand, in the non-volatile memory device, the second voltage V2 greater than 0V is applied to the second semiconductor substrate 314 (see FIGS. 3 and 4). Thus, a voltage difference between the first semiconductor substrate 312 and the second semiconductor substrate 314 decreases, and current leakage does not occur between the first semiconductor substrate 312 and the second semiconductor substrate 314. In addition, since the second voltage V2 is less than the first voltage V1, the erase operation is not performed in the second semiconductor substrate 314.

Instead of applying the second voltage V2 to the second semiconductor substrate 314, the second semiconductor substrate 314 may be floated.

A third voltage V3 may be applied to the non-volatile memory cell transistors TM2_1 through TM2_$n$ and TM4_1 through TM4_$n$ of the second and fourth memory cell blocks MCB2 and MCB4, which are in a column of memory cell blocks different to the first memory cell block MCB1 which is to be erased. The third voltage V3 is greater than the second voltage V2, and is less than the first voltage V1.

If it is assumed that the voltages of the non-volatile memory cell transistors TM2_1 through TM2_$n$ and TM4_1 through TM4_$n$ of the second and fourth memory cell blocks MCB2 and MCB4 are floated (see FIG. 6), a gate voltage of the non-volatile memory cell transistors TM2_1 through TM2_$n$ might increase due to the first voltage V1 applied to the first semiconductor substrate 312. In particular, in a structure in which gates of the non-volatile memory cell transistors TM2_1 through TM2_$n$ and gates of the non-volatile memory cell transistors TM4_1 through TM4_$n$ are connected, and since a gate voltage of the non-volatile memory cell transistors TM4_1 through TM4_$n$ increases, the non-volatile memory cell transistors TM4_1 through TM4_$n$ can be programmed.

On the other hand, in the non-volatile memory device, since the third voltage V3 is applied to the non-volatile memory cell transistors TM2_1 through TM2_$n$ and TM4_1 through TM4_$n$, the gate voltage of the non-volatile memory cell transistors TM2_1 through TM2_$n$ and TM4_1 through TM4_$n$ does not increase. In addition, since the third voltage V3 is greater than the second voltage V2 applied to the second semiconductor substrate 314, the erase operation is not performed in the second memory cell block MCB12. Since the third voltage V3 is less than the first voltage V1 applied to the first semiconductor substrate 312, the program operation is not performed in the fourth memory cell block MCB4. To achieve this, a voltage difference between the third voltage V3 and the second voltage V2 may be set so as to be less than a voltage difference required for programming the non-volatile memory cell transistors TM2_1 through TM2_n and TM4_1 through TM4_n.

A fourth voltage V4 may be applied to gates of the non-volatile memory cell transistors TM1_1 through TM1_n of the first memory cell block MCB1 to which the erase operation is to be performed. In addition, the fourth voltage V4 may be also applied to gates of the non-volatile memory cell transistors TM3_1 through TM3_n of the third memory cell block MCB3, which is in the same column as the first memory cell block MCB1 to be erased.

A voltage difference between the fourth voltage V4 and the second voltage V2 applied to the second semiconductor substrate 314 may be less than a voltage dereference required to erase the non-volatile memory cell transistors TM3_1 through TM3_n. A voltage difference between the fourth voltage V4 and the first voltage V1 applied to the first semiconductor substrate 312 may be greater than a voltage difference required to erase the non-volatile memory cell transistors TM1_1 through TM1_n. Thus, while the erase operation on the non-volatile memory cell transistors TM3_1 through TM3_n is not performed, the erase operation on the non-volatile memory cell transistors TM1_1 through TM1_n can be performed. For example, the fourth voltage V4 may be 0 V.

Referring to FIGS. 3 and 4, the non-volatile memory device may include the word lines WL1_1 through WL1_n, WL2_1 through WL2_n, WL3_1 through WL3_n, and WL4_1 through WL4_n.

The word lines WL1_1 through WL1_n, WL2_1 through WL2_n, WL3_1 through WL3_n, and WL4_1 through WL4_n may be connected to gates of the non-volatile memory cell transistors TM1_1 through TM1_n, TM2_1 through TM2_n, TM3_1 through TM3_n, and TM4_1 through TM4_n, respectively. In this case, the third voltage V3 and the fourth voltage V4 may be applied to the gates of the non-volatile memory cell transistors TM1_1 through TM1_n, TM2_1 through TM2_n, TM3_1 through TM3_n, and TM4_1 through TM4_n via the word lines WL1_1 through WL1_n, WL2_1 through WL2_n, WL3_1 through WL3_n, and WL4_1 through WL4_n.

Referring to FIGS. 3 and 4, word lines (e.g., WL1_1 and WL3_1 or WL2_1 and WL4_1) in the same column as each other may be connected to each other. The same voltage may be applied to the word lines connected each other. The applied voltage may be applied to a gate of a corresponding non-volatile memory cell transistor. For example, the same voltage is applied to the word line WL1_1 and the word line WL3_1, and then the applied voltage may be applied to gates of the non-volatile memory cell transistors TM1_1, TM3_1.

The word lines (e.g., WL1_1 and WL3_1 or WL2_1 and WL4_1) connected to each other may be connected to each other by a decoder (not shown). The decoder connects the word lines (e.g., WL1_1 and WL3_1 or WL2_1 and WL4_1) and applies the same voltage to the word lines.

The non-volatile memory device may further include first through fourth ground selection transistors TGS1, TGS2, TGS3 and TGS4, and first through fourth string selection transistors TSS1, TSS2, TSS3 and TSS4. The first through fourth ground selection transistors TGS1, TGS2, TGS3 and TGS4, and the first through fourth string selection transistors TSS1, TSS2, TSS3 and TSS4 may belong to the first through fourth memory cell blocks MCB1 through MCB4. The first through fourth ground selection transistors TGS1, TGS2, TGS3 and TGS4 may be connected to a respective one of the non-volatile memory cell transistors TM1_n, TM2_n, TM3_n and TM4_n, which are disposed at a side thereof. The first through fourth string selection transistors TSS1, TSS2, TSS3 and TSS4 may be connected to a respective one of the non-volatile memory cell transistors TM1_1, TM2_1, TM3_1 and TM4_1, which are disposed at a side thereof.

The third voltage V3 may be applied to gates of the second and fourth ground selection transistors TGS2 and TGS4 and gates of the second and fourth string selection transistors TSS2 and TSS4, belonging to the second and forth memory cell blocks MCB2 and MCB4, which are in a different column of cell blocks to the first memory cell block MCB1 which is to be erased. In addition, the fourth voltage V4 may be applied to gates of the first and third ground selection transistors TGS1 and TGS3 and gates of the first and third string selection transistors TSS1 and TSS3, belonging to the first memory cell block MCB1 and the third memory cell block MCB3 disposed in the same column as the first memory cell block MCB1.

Figure 7:
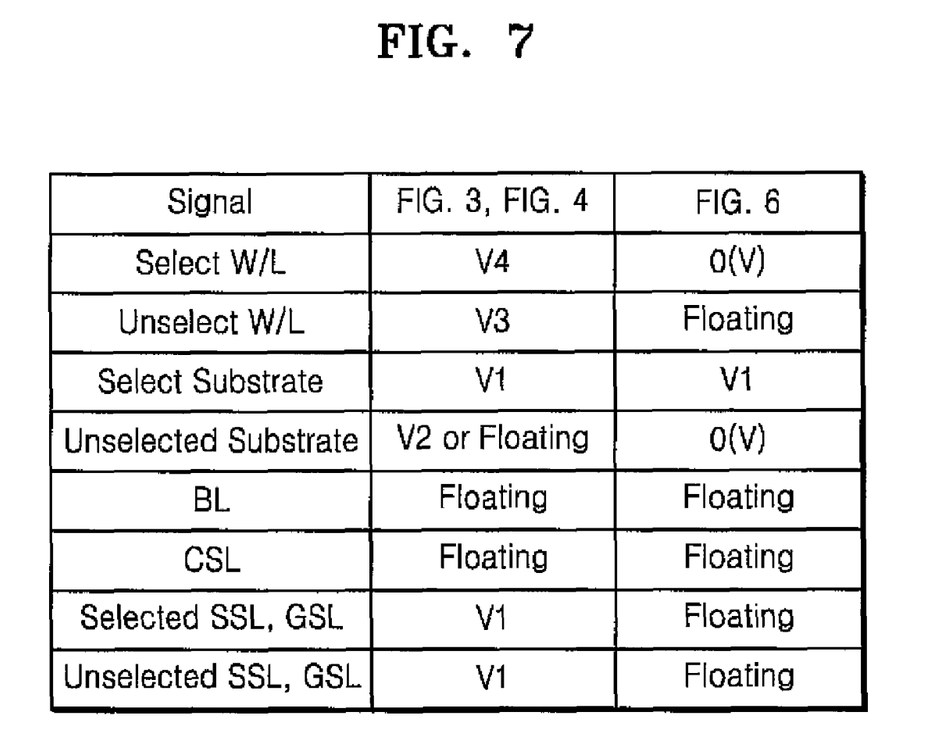
FIG. 7 is a table showing exemplary bias conditions applied to the non-volatile memory devices of FIGS. 3, 4 and 6.

FIG. 7 is table showing the above-mentioned bias conditions.

The first string selection transistor TSS1 of FIG. 4 may include a gate electrode CGTSS1 and the source and drain regions 321 and 322, disposed on the first semiconductor substrate 312. The second string selection transistor TSS2 may include a gate electrode CGTSS2 and the source and drain regions 330 and 331, disposed on the first semiconductor substrate 312. Each of the third and fourth string selection transistors TSS3 and TSS4 may have a similar structure to the first or second string selection transistor TSS1 or TSS2.

The first ground selection transistor TGS1 of FIG. 4 may include a gate electrode CGTGS1 and the source and drain regions 325 and 326, disposed on the first semiconductor substrate 312. The second ground selection transistor TGS2 may include a gate electrode CGTGS2 and the source and drain regions 345 and 346, disposed on the second semiconductor substrate 314. Each of the third and fourth ground selection transistors TGS3 and TGS4 may have a similar structure to the first or second ground selection transistor TGS1 or TGS2.

Gate electrodes CGTSS1, CGTSS2, CGTSS3 and CGTSS4 may be included in string selection line patterns SSLP1, SSLP2, SSLP3 and SSLP4 constituting the first through fourth string selection lines SSL1, SSL2, SSL3 and SSL4 (see FIG. 5). The gate electrodes CGTGS1, CGTGS2, CGTGS3 and CGTGS4 may be included in ground selection line patterns GSLP1, GSLP2, GSLP3 and GSLP4 constituting the first through fourth ground selection lines GSL1, GSL2, GSL3 and GSL4 (see FIG. 5).

The non-volatile memory device may further include the charge supply line CSL. The charge supply line CSL may be a common source line. The charge supply line CSL perpendicularly passes through the first and second semiconductor substrates 312 and 314, and supplies or shuts electric charges to the non-volatile memory cell transistors TM1_1 through TM1_n, TM2_1 through TM2_n, TM3_1 through TM3_n, and TM4_1 through TM4_n.

The non-volatile memory device may further include the bit line BL and contacts DC1 and DC2. The contacts DC1 and DC2 pass through the first and second semiconductor substrates 312 and 314, and electrically connect the bit line BL and the non-volatile memory cell transistors TM1_1 through TM1_n, TM2_1 through TM2_n, TM3_1 through TM3_n, and TM4_1 through TM4_n.

The non-volatile memory cell transistors TM1_1 through TM1_n, TM2_1 through TM2_n, TM3_1 through TM3_n, and TM4_1 through TM4_n may each be a NAND flash memory cell transistor.

The non-volatile memory device may be installed in a memory card for supporting storage capacity of a large amount of data or an information processing system such as a mobile device or a desk top computer.

Figure 8:
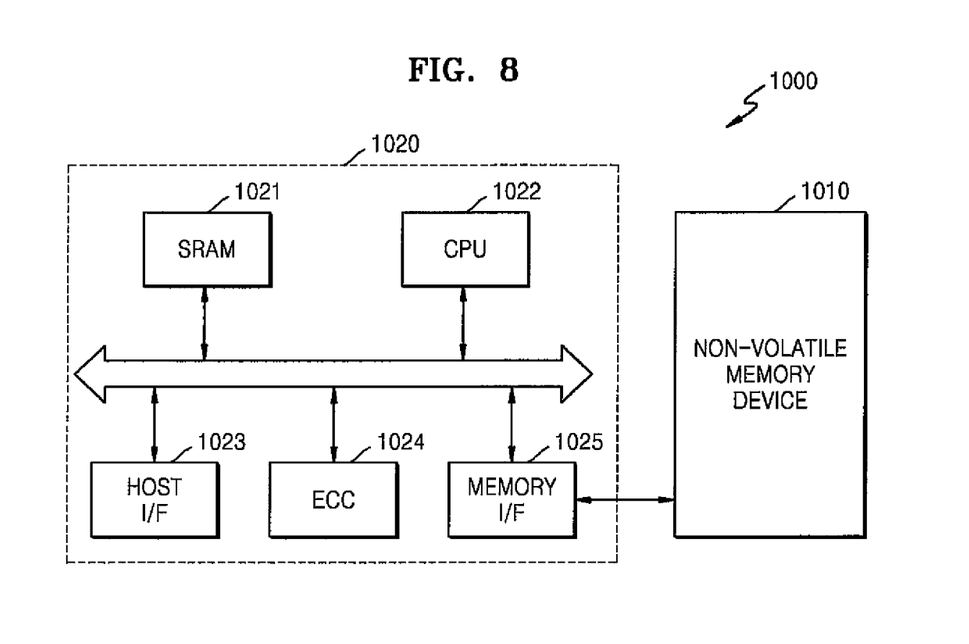
FIG. 8 is a block diagram of a memory card incorporating non-volatile memory according to an embodiment of the inventive concept.

FIG. 8 is a block diagram of a memory card 1000 incorporating non-volatile memory according to an embodiment of the inventive concept.

Referring to FIG. 8, the memory card 1000 may include a non-volatile memory device 1010. The memory card 1000 may include a memory controller 1020 controlling data exchange between a host and the non-volatile memory device 1010.

A static random access memory (SRAM) 1021 is used as an operation memory of a processing unit 1022. A host interface 1023 includes a data exchange protocol of a host connected to the memory card 1000. An error correction block 1024 detects and corrects an error included in data read from the non-volatile memory device 1010. A memory interface 1025 interfaces with the non-volatile memory device 1010. The processing unit 1022 performs a controlling operation related to data exchange of the memory controller 1020. Although not illustrated, the memory card 1000 may further include an ROM (not shown) storing code data for interfacing to a host.

A non-volatile memory device and a memory card may be provided in a memory system such as a solid state disk (SSD) device.

Figure 9:
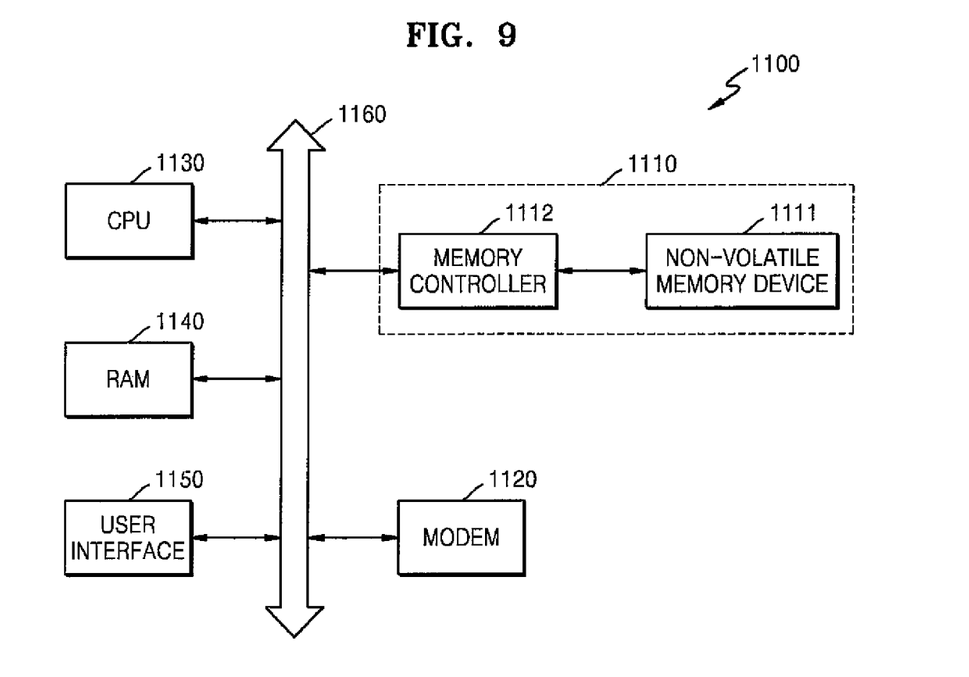
FIG. 9 is a block diagram of an information processing system incorporating non-volatile memory according to an embodiment of the inventive concept.

FIG. 9 is a block diagram of an information processing system 1100 incorporating non-volatile memory according to an embodiment of the inventive concept.

Referring to FIG. 9, the information processing system 1100 may include a non-volatile memory device 1111. The non-volatile memory device 1111 may be included in a non-volatile memory system 1110. The information processing system 1100 may include the non-volatile memory system 1110, a modem 1120, a central processing unit (CPU) 1130, a RAM 1140 and a user interface 1150, which are each connected to a system bus 1160. The non-volatile memory system 1110 stores data processed by the CPU 1130 and data input from an external source. The non-volatile memory system 1110 may constitute an SSD device. In this case, the information processing system 1100 can stably store a large amount of data in the non-volatile memory system 1110. Due to increased reliability, the non-volatile memory system 1110 can reduce the amount of resources required to correct errors, and thus the non-volatile memory system 1110 can exchange data at high speed in the information processing system 1100. Although not illustrated, the information processing system 1100 may further include an application chipset, a camera image processor (CIS), a mobile DRAM, an input/output device, or the like.

The non-volatile memory device 1111 may be a flash memory device that can retain stored data when power is not supplied thereto. As mobile devices such as cellular phones, personal digital assistances (PDAs), digital cameras, portable game consoles and MP2 players are widely used, a flash memory device is used for code storage as well as data storage. A flash memory may be used in home application such as HDTV, DVD, a router and a global positioning system (GPS).

In addition, the non-volatile memory device may be installed using various packaging manners. For example, the non-volatile device may be packaged and installed using a method such as package on package (PoP), ball grid arrays (BGAs), chip scale packages (CSPs), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flatpack (TQFP), small outline (SOIC), shrink small outline package (SSOP), thin small outline (TSOP), thin quad flatpack (TQFP), system in package (SIP), multi chip package (MCP), wafer-level fabricated package (WFP), wafer-level processed stack Package (WSP), or the like.

An erase method for a non-volatile memory device may include grouping a plurality of non-volatile memory cell transistors formed on semiconductor substrates into two or more memory cell blocks, wherein the non-volatile memory cells include a plurality of semiconductor substrates that are sequentially stacked, and a plurality of non-volatile memory cell transistors that are formed in a row on the semiconductor substrates.

The erase method includes, for example, applying a first voltage to a semiconductor substrate to which a memory cell block to be erased belongs in order to perform an erase operation on the memory cell block to be erased; and applying a second voltage less than the first voltage and greater than the second voltage to a semiconductor substrate to which the memory cell block to be erased does not belong.

The erase operation further includes applying a third voltage greater than the second voltage and less than the first voltage to gates of non-volatile memory cell transistors belonging to memory cell blocks, which are in a different column to the memory cell block to be erased. A voltage difference between the third voltage and the second voltage is less than voltage difference required to program the non-volatile memory cell transistors.

The erase method may further include applying a fourth voltage less than the second voltage to word lines connected to a memory block, which match the memory cell block to be erased in a perpendicular direction to the memory cell block, and the memory cell block to be erased. A voltage difference between the second voltage and the forth voltage is less than a voltage difference required to erase the volatile memory cell transistors. A voltage difference between the first voltage and the fourth voltage is greater than a voltage difference required to erase the non-volatile memory cell transistors.

Since operations of the above mentioned non-volatile memory device are as previously described, their descriptions are not repeated.

While the inventive concept has been particularly shown and described with reference to exemplary embodiments thereof, it will be understood that various changes in form and details may be made therein without departing from the scope of the following claims.

What is claimed is:

1. A non-volatile memory device comprising:
   first and second, vertically stacked semiconductor substrates;
   a plurality of non-volatile memory cell transistors formed in a row on the first and second semiconductor substrates; and
   a plurality of word lines connected to gates of the plurality of non-volatile memory cell transistors,
   wherein the plurality of non-volatile memory cell transistors as formed on the first and second semiconductor substrates are grouped into two or more memory cell blocks, such that a first voltage is applied to the first semiconductor substrate including a first memory cell block to be erased, and either
   (1) a second voltage less than the first voltage and greater than 0V is applied to the second semiconductor substrate not including the first memory cell block, or
   (2) the second semiconductor substrate not including the first memory cell block is allowed to electrically float.

2. The non-volatile memory device of claim 1, wherein a third voltage greater than the second voltage and less than the first voltage is applied to word lines connected to memory cell blocks that are in a different column than the first memory cell block.

3. The non-volatile memory device of claim 2, wherein a voltage difference between the third voltage and the second voltage is less than a voltage difference required to program the plurality of non-volatile memory cell transistors.

4. The non-volatile memory device of claim 1, wherein a fourth voltage is applied to word lines connected to the first memory cell block and to word lines connected to memory cell blocks that are in the same column as the first memory cell block, and
a voltage difference between the second voltage and the fourth voltage is less than a voltage difference required to erase the plurality of non-volatile memory cell transistors.

5. The non-volatile memory device of claim 4, wherein a voltage difference between the first voltage and the fourth voltage is greater than a voltage difference required to erase the plurality of non-volatile memory cell transistors.

6. The non-volatile memory device of claim 1, wherein word lines that are in the same column among the plurality of word lines are connected to each other to receive the same bias voltage.

7. The non-volatile memory device of claim 2, wherein each of the memory cell blocks further comprises;
a ground selection transistor connected to a non-volatile memory cell transistor disposed at one side of the non-volatile memory device among the plurality of non-volatile memory cell transistors; and
a string selection transistor connected to a non-volatile memory cell transistor disposed at the other side of the non-volatile memory device,
wherein the third voltage is applied to gates of the ground selection transistor and the string selection transistor included in memory cell blocks that are in a different column than the first memory cell block.

8. The non-volatile memory device of claim 1, further comprising:
at least one charge supply line passing through the plurality of semiconductor substrates and supplying charge to the plurality of non-volatile memory cell transistors;
a bit line; and
at least one contact perpendicularly passing through the plurality of semiconductor substrates and electrically connecting the bit line with the plurality of non-volatile memory cell transistors.

9. The non-volatile memory device of claim 1, wherein each of the plurality of non-volatile memory cell transistors is a NAND flash memory cell transistor.

10. A flash memory card comprising:
a memory controller configured to control the operation of a non-volatile memory device, wherein the non-volatile memory device comprises:
first and second, vertically stacked semiconductor substrates;
a plurality of non-volatile memory cell transistors formed in a row on the first and second semiconductor substrates; and
a plurality of word lines connected to gates of the plurality of non-volatile memory cell transistors,
wherein the plurality of non-volatile memory cell transistors as formed on the first and second semiconductor substrates are grouped into two or more memory cell blocks, such that a first voltage is applied to the first semiconductor substrate including a first memory cell block to be erased, and either
(1) a second voltage less than the first voltage and greater than 0V is applied to the second semiconductor substrate not including the first memory cell block, or
(2) the second semiconductor substrate not including the first memory cell block is allowed to electrically float.

11. A flash memory system comprising:
a Central Processing Unit (CPU) configured to control the operation of a memory system and connected to the memory system via a system bus,
wherein the memory system comprises; a memory controller configured to control the operation of a non-volatile memory device, and the non-volatile memory device comprises:
first and second, vertically stacked semiconductor substrates;
a plurality of non-volatile memory cell transistors formed in a row on the first and second semiconductor substrates; and
a plurality of word lines connected to gates of the plurality of non-volatile memory cell transistors,
wherein the plurality of non-volatile memory cell transistors as formed on the first and second semiconductor substrates are grouped into two or more memory cell blocks, such that a first voltage is applied to the first semiconductor substrate including a first memory cell block to be erased, and either
(1) a second voltage less than the first voltage and greater than 0V is applied to the second semiconductor substrate not including the first memory cell block, or
(2) the second semiconductor substrate not including the first memory cell block is allowed to electrically float.

12. A non-volatile memory device comprising:
first and second, vertically stacked semiconductor substrates; and
a plurality of non-volatile memory cell transistors formed in a row on the semiconductor substrates,
wherein the plurality of non-volatile memory cell transistors formed on the first and second semiconductor substrates are grouped into two or more memory cell blocks, such that a first voltage is applied to the first semiconductor substrate including a first memory cell block to be erased, a second voltage less than the first voltage and greater than 0V is applied to the second semiconductor substrate not including the first memory cell block, and a third voltage greater than the second voltage and less than the first voltage is applied to gates of non-volatile memory cell transistors in memory cell blocks that are in a different column from the first memory cell block.

13. The non-volatile memory device of claim 12, wherein a fourth voltage less than the second voltage is applied to gates of non-volatile memory cell transistors included in the first memory cell block and memory cell blocks that are in the same column as the first memory cell block, and
wherein a voltage difference between the second voltage and the fourth voltage is less than a voltage difference required to erase the plurality of non-volatile memory cell transistors.

14. The non-volatile memory device of claim 12, wherein a voltage difference between the third voltage and the second voltage is a voltage difference required to program the plurality of non-volatile memory cell transistors.

15. The non-volatile memory device of claim 13, wherein a voltage difference between the first voltage and the fourth voltage is greater than a voltage difference required to erase the plurality of non-volatile memory cell transistors.

16. The non-volatile memory device of claim 12, wherein word lines among the plurality of word lines disposed in a same column are connected to each other to receive the same bias voltage.

17. An erase method for a non-volatile memory device comprising first and second, vertically stacked semiconductor substrates, and a plurality of non-volatile memory cell transistors formed in a row on the first and second semiconductor substrates, wherein the plurality of non-volatile memory cell transistors formed on the first and second semiconductor substrates are grouped into two or more memory cell blocks, the method comprising:

applying a first voltage to the first semiconductor substrate including a first memory cell block to be erased; and either (1) applying a second voltage less than the first voltage and greater than 0V to the second semiconductor substrate not including the first memory cell block, or (2) applying a floating voltage to the second semiconductor substrate not including the first memory cell block.

18. The method of claim 17, further comprising:

applying a third voltage greater than the second voltage and less than the first voltage to gates of non-volatile memory cell transistors included in memory cell blocks that are in a same column as the first memory cell block, wherein a voltage difference between the third voltage and the second voltage is less than a voltage difference required to program the plurality of non-volatile memory cell transistors.

19. The method of claim 17, further comprising:

applying a fourth voltage to word lines connected to the first memory cell block and to word lines connected to memory cell blocks that are in a same column as the first memory cell block, wherein a voltage difference between the second voltage and the fourth voltage is less than a voltage difference required to erase the plurality of non-volatile memory cell transistors, and a voltage difference between the first voltage and the fourth voltage is greater than a voltage difference required to erase the plurality of non-volatile memory cell transistors.

* * * * *